United States Patent
Gai et al.

(10) Patent No.: US 10,355,064 B2
(45) Date of Patent: Jul. 16, 2019

(54) AMOLED DISPLAY SUBSTRATE, METHOD FOR FABRICATING THE SAME AND DISPLAY DEVICE

(71) Applicant: BOE TECHNOLOGY GROUP CO., LTD., Beijing (CN)

(72) Inventors: Cuili Gai, Beijing (CN); Yicheng Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/736,774

(22) PCT Filed: May 26, 2017

(86) PCT No.: PCT/CN2017/086074
§ 371 (c)(1),
(2) Date: Dec. 14, 2017

(87) PCT Pub. No.: WO2017/219827
PCT Pub. Date: Dec. 28, 2017

(65) Prior Publication Data
US 2018/0358421 A1    Dec. 13, 2018

(30) Foreign Application Priority Data
Jun. 24, 2016  (CN) .......................... 2016 1 0473804

(51) Int. Cl.
*H01L 21/77* (2017.01)
*H01L 27/32* (2006.01)
(Continued)

(52) U.S. Cl.
CPC .......... *H01L 27/3265* (2013.01); *H01L 21/77* (2013.01); *H01L 27/3262* (2013.01);
(Continued)

(58) Field of Classification Search
None
See application file for complete search history.

(56) References Cited

U.S. PATENT DOCUMENTS 8,106,402 B2 * 1/2012 Yeo ..................... H01L 27/3248
257/59
2005/0285197 A1  12/2005 Park
(Continued)

FOREIGN PATENT DOCUMENTS

| CN | 1716635 A | 1/2006 |
| CN | 1874001 A | 12/2006 |

(Continued)

OTHER PUBLICATIONS

Chinese Search Report, for Chinese Patent Application No. 201610473804.2, dated Sep. 23, 2016, 9 pages.
(Continued)

*Primary Examiner* — Fernando L Toledo
*Assistant Examiner* — Valerie N Newton
(74) *Attorney, Agent, or Firm* — Kinney & Lange, P.A.

(57) ABSTRACT

The present disclosure provides an active-matrix organic light emitting diode display substrate, a method for fabricating the display substrate and a display device. The active-matrix organic light emitting diode display substrate includes two storage capacitors connected in parallel, an active layer of TFT and an electrode of the new added storage capacitor are formed through a single patterning process, and the electrode is made of conductor material.

17 Claims, 4 Drawing Sheets

(51) Int. Cl.
*H01L 51/56* (2006.01)
*G03F 7/16* (2006.01)
*G03F 7/20* (2006.01)
*G03F 7/30* (2006.01)
*H01L 27/12* (2006.01)

(52) U.S. Cl.
CPC ............... *H01L 51/56* (2013.01); *G03F 7/16* (2013.01); *G03F 7/20* (2013.01); *G03F 7/30* (2013.01); *H01L 27/1288* (2013.01); *H01L 2227/323* (2013.01)

(56) References Cited

U.S. PATENT DOCUMENTS

| | | |
|---|---|---|
| 2010/0193790 A1 | 8/2010 | Yeo et al. |
| 2014/0209912 A1 | 7/2014 | Liu et al. |
| 2015/0263135 A1 | 9/2015 | Park |

FOREIGN PATENT DOCUMENTS

| | | |
|---|---|---|
| CN | 101794049 A | 8/2010 |
| CN | 103107095 A | 5/2013 |
| CN | 103293790 A | 9/2013 |
| CN | 105914229 A | 8/2016 |

OTHER PUBLICATIONS

First Chinese Office Action, for Chinese Patent Application No. 201610473804.2, dated Nov. 28, 2016, 11 pages.
Second Chinese Office Action, for Chinese Patent Application No. 201610473804.2, dated Feb. 28, 2017, 7 pages.
Third Chinese Office Action, for Chinese Patent Application No. 201610473804.2, dated May 26, 2017, 8 pages.
Fourth Chinese Office Action, for Chinese Patent Application No. 201610473804.2, dated Sep. 1, 2017, 11 pages.
International Search Report & Written Opinion, for PCT Patent Application No. PCT/CN2017/086074, dated Aug. 14, 2017, 18 pages.

\* cited by examiner

AMOLED DISPLAY SUBSTRATE, METHOD FOR FABRICATING THE SAME AND DISPLAY DEVICE

CROSS-REFERENCE TO RELATED APPLICATION

This application is the U.S. national phase of PCT Application No. PCT/CN2017/086074 filed on May 26, 2017, which claims a priority to Chinese Patent Application No. 201610473804.2 filed on Jun. 24, 2016, the disclosures of which are incorporated in their entirety by reference herein.

TECHNICAL FIELD

The present disclosure relates to the field of display technology, and in particular to an AMOLED display substrate, a method for fabricating the same and a display device.

BACKGROUND

Recently, organic light emitting diodes (OLED) have become a popular and emerging flat-panel display product at home and abroad, because of display characteristics, such as active light emission, a large visibility angle, a short response time, a high luminous efficiency, a wide color gamut, a low operating voltage, a thin panel, capability of fabricating a flexible panel of a large size and a simple fabricating process, and potential of a low cost.

OLED can be divided into passive-matrix OLED (PMOLED) and active-matrix OLED (AMOLED) according to a driving type. An oxide thin film transistor (Thin-Film Transistor, short for TFT) backplane or a low temperature polysilicon TFT is usually used to drive AMOLED. Compared to an amorphous silicon TFT, the oxide TFT backplane has a relatively high mobility, and compared to the low temperature polysilicon TFT, TFT with an ESL structure (etch stop structure) has a simple fabricating process, requires few mask plates, and is easy to achieve a mass production process.

The TFT with the ESL structure has a relatively large parasitic capacitance Cgs, and requires a large storage capacitor Cst enough to ensure a normal display function.

SUMMARY

The present disclosure provides a method for fabricating an AMOLED display substrate in embodiments, including forming a plurality of pixel units. Forming each of the pixel units includes: forming a first storage capacitor, a thin film transistor and a light emitting diode in a manner of forming an active layer of the thin film transistor and a first electrode of the first storage capacitor through a single patterning process, where the first electrode is made of conductor material.

The present disclosure further provides an AMOLED display substrate in the embodiments, which is fabricated by the above fabricating method.

The present disclosure further provides a display substrate in the embodiments, including the above AMOLED display substrate.

BRIEF DESCRIPTION OF THE DRAWINGS

In order to more clearly illustrate technical solutions in embodiments of the present disclosure or in the related technologies, drawings used in the descriptions of the embodiments or the related technologies are described briefly hereinafter. Obviously, the drawings described hereinafter are only some embodiments of the present disclosure, and other drawings may be obtained by those skilled in the art based on these drawings without creative efforts.

DETAILED DESCRIPTION

The present disclosure provides an AMOLED display substrate and a fabricating method thereof. The display substrate includes a plurality of pixel units, each of the pixel units includes a thin film transistor and a light emitting diode, and the light emitting diode includes a bottom electrode, a top electrode and a light-emitting layer located between the bottom electrode and the top electrode. The bottom electrode is electrically connected with a drain electrode of the thin film transistor, and a data signal is transmitted to the bottom electrode via the thin film transistor to drive the light emitting diode to emit light. Each of the pixel units further includes a storage capacitor configured to maintain a voltage of the bottom electrode during displaying one frame to realize an image display.

To overcome the interference of a parasitic capacitance, a capacitance of the storage capacitor is required to be increased. According to the present disclosure, the storage capacitor includes a first storage capacitor and a second storage capacitor connected in parallel, and the capacitance of the storage capacitor is the sum of a capacitance of the first storage capacitor and a capacitance of the second storage capacitor.

The second storage capacitor is formed by the drain electrode of the thin film transistor, the top electrode of the light emitting diode and a first dielectric layer between the drain electrode and the top electrode. On the basis of the second storage capacitor, a first electrode is added, and the first electrode, the drain electrode and a second dielectric layer between the first electrode and the drain electrode form the first storage capacitor to make the first storage capacitor and the second storage capacitor connected in parallel, thus providing a larger capacitance and maintaining the voltage of the bottom electrode during displaying one frame.

The voltage applied to the top electrode is a common voltage, and the first electrode may be electrically connected with the top electrode.

Hereinafter specific implementations of the present disclosure will be described in detail in conjunction with the drawings and the embodiments. The following embodiments are to illustrate the present disclosure, but not to limit the scope of the present disclosure.

An embodiment provides a method for fabricating an AMOLED display substrate, including:

forming a plurality of pixel units, where forming each of the pixel units includes:

forming a thin film transistor, a light emitting diode and a first storage capacitor in a manner of forming an active layer of the thin film transistor and a first electrode of the first storage capacitor through a single patterning process, where the first electrode is made of conductor material.

According to the above fabricating method, the active layer of the thin film transistor and the first electrode of the first storage capacitor are formed through a single patterning process, without an individual fabricating process to form the first electrode of the first storage capacitor, and the first electrode is made of conductor material, without additional processing such as conductive treating, and thus simplifying the fabricating process and reducing the cost.

The active layer of the thin film transistor may be made of silicon semiconductor material, such as amorphous silicon or polysilicon, and may also be made of metal oxide semiconductor material, such as ZnO, IZO, IGZO, or ITZO.

The step of forming the active layer and the first electrode through a single patterning process includes:

forming a semiconductor film layer and a conductive film layer successively, and performing a single patterning process on the semiconductor film layer and the conductive film layer to form the active layer and the first electrode, where the active layer is formed by the semiconductor film layer, and the first electrode is formed by the conductive film layer.

Figure 2:
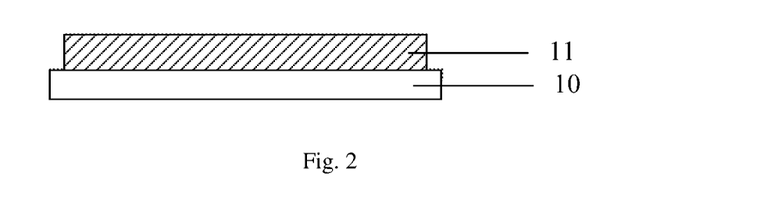
FIG. 2 to FIG. 7 are schematic diagrams of a process for fabricating an AMOLED display substrate according to an embodiment of the present disclosure.
Figure 3:
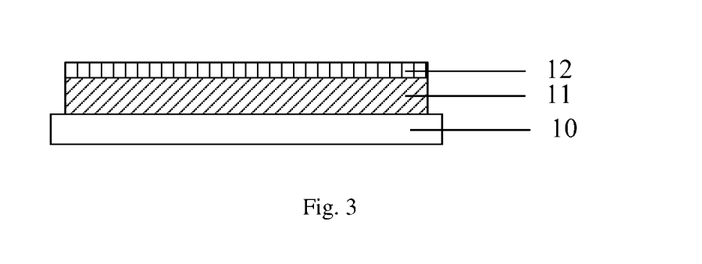
Figure 4:
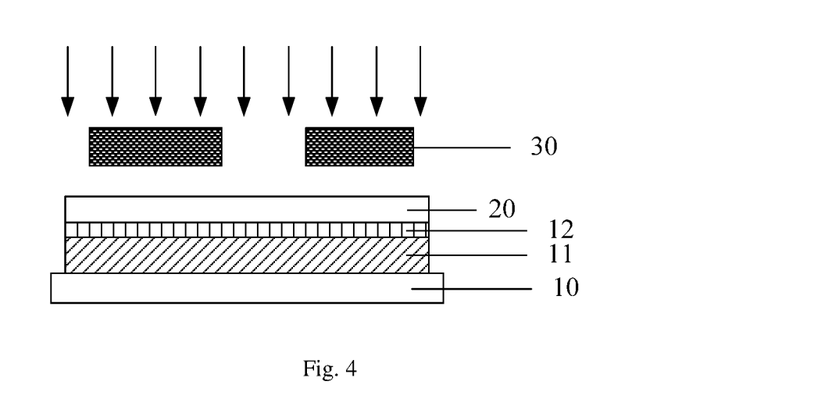
Figure 5:
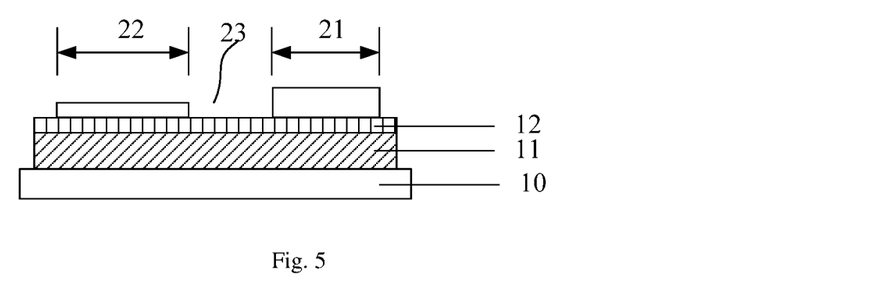
Figure 6:
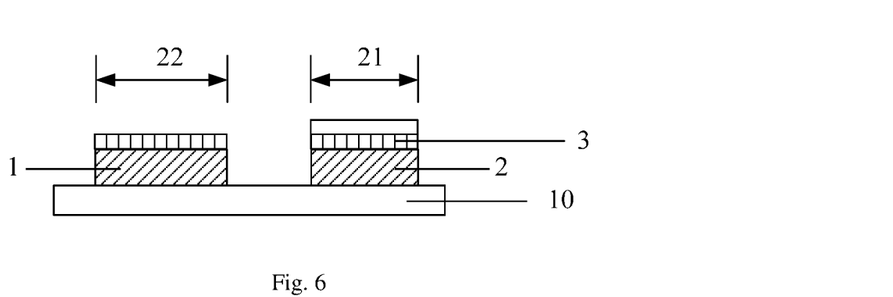
Figure 7:
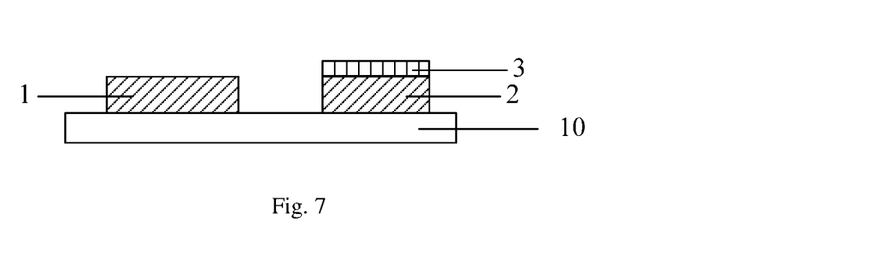

As shown in FIGS. 2 to 7, the step of forming the active layer and the first electrode through a single patterning process to form the active layer and the first electrode specifically includes:

forming a semiconductor film layer 11 and a conductive film layer 12 successively, as shown in FIGS. 2 and 3;

coating a first photoresist 20 on the conductive film layer 12, as shown in FIG. 4;

exposing the first photoresist 20 by using a mask plate 30 with a halftone or gray tone, and developing to form a first photoresist fully-reserved region 21, a first photoresist partially-reserved region 22 and a first photoresist unreserved region 23, where the first photoresist fully-reserved region 21 corresponds to a region where the first electrode is located, the first photoresist partially-reserved region 22 corresponds to a region where the active layer is located, and the first photoresist unreserved region 23 corresponds to the other region, as shown in FIGS. 4 to 5;

removing the conductive film layer and the semiconductor film layer of the first photoresist unreserved region 23;

removing the first photoresist of the first photoresist partially-reserved region 22 through an ashing process, as shown in FIG. 6;

removing the conductive film layer of the first photoresist partially-reserved region 22; and stripping the remaining photoresist to form an active layer 1 and a first electrode 3, as shown in FIG. 7.

In the above steps, a photoetching process is performed by using the mask plate with the halftone or gray tone to simultaneously form the active layer 1 of the thin film transistor and the first electrode 3 of the first storage capacitor. There is a pattern of the semiconductor layer 2 under the fabricated first electrode 3, which is the same as a pattern of the first electrode 3.

Figure 8:
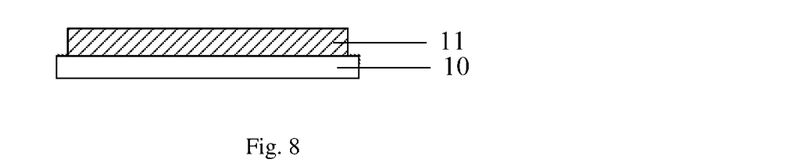
FIG. 8 to FIG. 14 are schematic diagrams of a process for fabricating an AMOLED display substrate according to another embodiment of the present disclosure.
Figure 9:
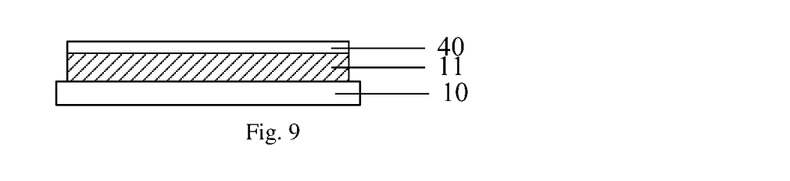
Figure 10:
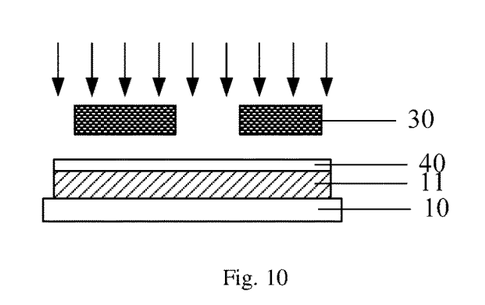
Figure 11:
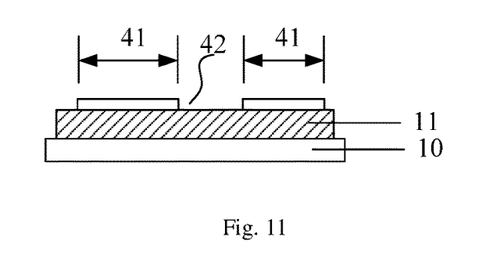
Figure 12:
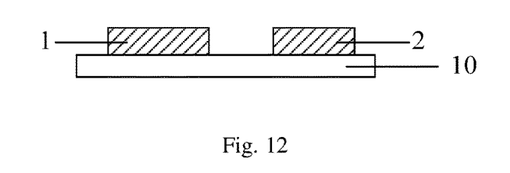
Figure 13:
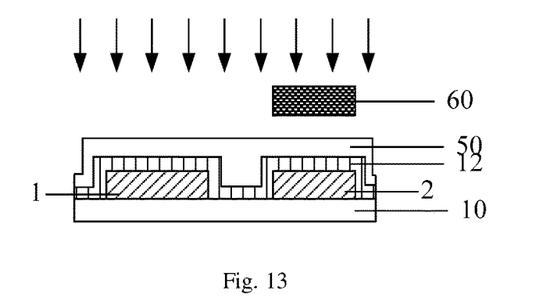
Figure 14:
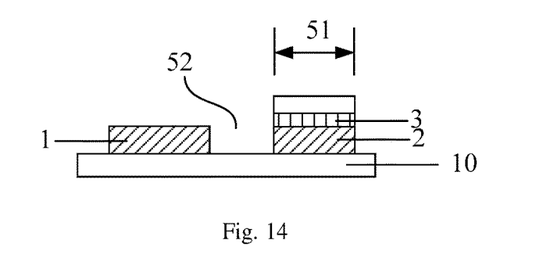

In practical applications, the active layer of the thin film transistor and the first electrode of the first storage capacitor may also be formed by the following steps, as shown in FIGS. 7 to 14:

forming a semiconductor film layer 11, as shown in FIG. 8;

forming a second photoresist 40 on the semiconductor film layer 11, as shown in FIG. 9;

exposing the second photoresist 40 through a first mask plate 30, and developing to form a second photoresist reserved region 41 and a second photoresist unreserved region 42, where the second photoresist reserved region 41 corresponds to a region where the active layer of the thin film transistor and the first electrode of the first storage capacitor are located, and the second photoresist unreserved region 42 corresponds to the other region, as shown in FIG. 11;

removing the semiconductor film layer of the second photoresist unreserved region 42, and stripping the remaining photoresist to form a pattern of the active layer 1 and the semiconductor layer 2 of the thin film transistor, as shown in FIG. 12;

forming a conductive film layer 12 on the active layer 1, coating a third photoresist 50 on the conductive film layer 12, and exposing the third photoresist 50 through a third mask plate 60, as shown in FIG. 13;

developing to form a third photoresist reserved region 51 and a third photoresist unreserved region 52, and removing the semiconductor film layer of the third photoresist unreserved region 52, where the third photoresist reserved region 51 corresponds to a region where the first electrode of the first storage capacitor is located, and the third photoresist unreserved region 52 corresponds to the other region, as shown in FIG. 14; and stripping the remaining photoresist to form a first electrode 3 of the first storage capacitor of the thin film transistor, as shown in FIG. 7.

Specifically, the semiconductor film is removed through a dry etching process, and the conductive film layer is removed through a wet etching process.

In the above steps, the first electrode 3 of the first storage capacitor is fabricated by the conductive film layer, which is made of conductor material, without additional processing such as conductive treating, and the first electrode 3 and the active layer 1 are simultaneously formed through a single patterning process, and thus simplifying the fabricating process and reducing the cost. There is a pattern of the semiconductor layer 2 under the fabricated first electrode 3, which is the same as the pattern of the first electrode 3. The semiconductor layer 2 and the active layer 1 are fabricated by one film layer.

In the foregoing, how to fabricate the first electrode 3 of the first storage capacitor is mainly described. A second electrode of the first storage capacitor may be the drain electrode of the thin film transistor, and a metal electrode can provide a larger capacitance.

The thin film transistor in the embodiment can be, but not limited to, a thin film transistor with an etch stop layer. Hereinafter the technical solutions of the present disclosure will be described in detail by taking the thin film transistor with the etch stop layer as an example.

Figure 15:
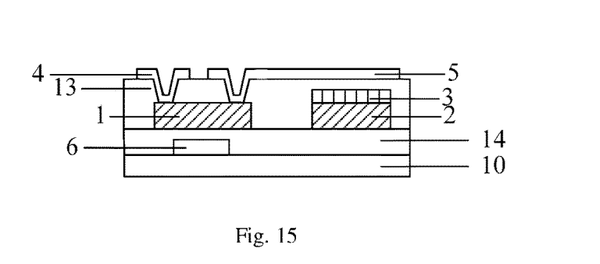
FIG. 15 is a schematic diagram of a part of each pixel unit of an AMOLED display substrate according to an embodiment of the present disclosure.

For the thin film transistor with the etch stop structure, as shown in FIG. 15, the fabricating method further includes:

forming an etch stop layer 13 covering the active layer 1 and the first electrode 3, where the etch stop layer 13 includes a via hole; and forming a source electrode 4 and a drain electrode 5 of the thin film transistor on the etch stop layer 13, where the source electrode 4 and the drain electrode 5 are in electrical contact with the active layer 1 via the via hole.

There is an overlapping region between a projection of the drain electrode 5 on a substrate 10 and a projection of the first electrode 3 on the substrate 10, and the drain electrode 5 is a second electrode of the first storage capacitor.

The dielectric layer (the etch stop layer) and the second electrode 5 of the first storage capacitor are fabricated by the above steps.

The thin film transistor with the etch stop structure as shown in FIG. 15 is of a bottom gate type, and the step for forming the thin film transistor specifically includes:

forming a gate electrode 6 on a substrate 10;
forming a gate insulating layer 14 covering the gate electrode 6;
forming an active layer 1 on the gate insulating layer 14;
forming an etch stop layer 13 covering the active layer 1;
forming a via hole in the etch stop layer 13; and
forming a source electrode 4 and a drain electrode 5 on the etch stop layer 13, where the source electrode 4 and the drain electrode 5 are in electrical contact with the active layer 1 through the via hole.

According to the process for fabricating the display substrate, the first electrode 3 of the first storage capacitor is formed while the active layer 1 is formed in the above steps, the specific process of which is described in the above, and is not repeated herein. The first electrode 3, the drain electrode 5 and the etch stop layer 13 between the first electrode 3 and the drain electrode 5 form a first storage capacitor.

The technical solutions of the present disclosure are applicable not only to the thin film transistor with the etch stop layer, but also to a thin film transistor with other structures. The thin film transistor may be of a bottom gate type, a top gate type, or a coplanar type, and when the active layer 1 is formed, it is only required to form the first electrode 3 and the insulating layer between the first electrode 3 and the drain electrode 5 to form the first storage capacitor.

Figure 1:
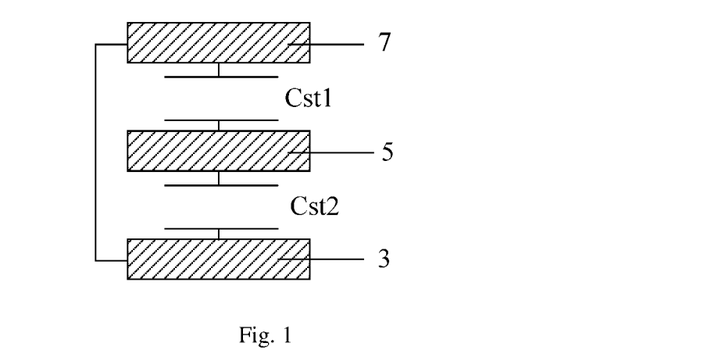
FIG. 1 is a schematic diagram of a storage capacitor of each pixel unit according to an embodiment of the present disclosure.

To overcome the interference of a parasitic capacitance, a capacitance of the storage capacitor is required to be increased, and in the embodiment, the step of forming each pixel unit further includes:

forming a second storage capacitor Cst2 connected in parallel with the first storage capacitor Cst1, as shown in FIG. 1, where a capacitance of the storage capacitor of each pixel unit is the sum of a capacitance of the first storage capacitor Cst1 and a capacitance of the second storage capacitor Cst2, which is capability to provide a large enough capacitance.

The drain electrode 5 of the thin film transistor functions as an electrode of both the first storage capacitor Cst1 and the second storage capacitor Cst2 to achieve the first storage capacitor Cst1 and the second storage capacitor Cst2 being connected in parallel.

The other electrode of the second storage capacitor Cst2 may function as the top electrode 7 of the light emitting diode, a common voltage is applied to the top electrode 7, the bottom electrode of the light emitting diode is connected with the drain electrode 5 of the thin film transistor, and a required data signal voltage is transmitted to the bottom electrode via the thin film transistor to drive a light-emitting layer to emit light. The first electrode 3 is electrically connected with the top electrode 7, as shown in FIG. 1.

The light emitting diode in the embodiment may be of a bottom emission type, a top emission type, or a double side emission type. Materials of the substrate 10, the bottom electrode and the top electrode may be selected according to a specific emission type. For example, for the light emitting diode of the bottom emission type, the substrate 10 may be a transparent substrate, such as a quartz substrate, or a glass substrate, and the top electrode may be made of reflective material such as Ag.

On basis of the same inventive concept, an embodiment provides an AMOLED display substrate, fabricated by the above fabricating method. Specifically, the active layer of the thin film transistor and the first electrode of the first storage capacitor are formed through a single patterning process, and the first electrode is made of conductor material, without an individual fabricating process to form the first electrode of the first storage capacitor and without additional processing such as conductive treating on the first electrode, which simplifies the fabricating process and reduces the cost.

In the embodiment, as shown in FIG. 15, there is a pattern of the semiconductor layer 2 under the first electrode 3, which is the same as a pattern of the first electrode 3, and the semiconductor layer 2 and the active layer 1 are formed by one film layer, such that a mask plate with a halftone or gray tone can be used to perform a single etching process to simultaneously form the active layer 1 and the first electrode 3.

There is an overlapping region between an orthographic projection of the first electrode 3 on a plane of the display substrate and an orthographic of the drain electrode 5 of the thin film transistor on a plane of the display substrate, and there is an etch stop layer between the first electrode and the drain electrode to form a first storage capacitor.

To overcome the interference of a parasitic capacitance, a capacitance of the storage capacitor is required to be increased, and each pixel unit in the embodiment further includes the second storage capacitor connected in parallel with the first storage capacitor. Specifically, the light emitting diode includes the bottom electrode and the top electrode, a common voltage is applied to the top electrode, and the bottom electrode is electrically connected with the drain electrode. As shown in FIG. 1, the top electrode 7 is electrically connected with the first electrode 3, there is an overlapping region between an orthographic projection of the top electrode 7 on a plane of the display substrate and an orthographic projection of the drain electrode 5 on the plane of the display substrate, and there is an insulating layer between the top electrode 7 and the drain electrode 5 to form a second storage capacitor Cst2. The drain electrode 5 functions as an electrode of both the first storage capacitor Cst1 and the second storage capacitor Cst2 to achieve the first storage capacitor Cst1 and the second storage capacitor Cst2 being connected in parallel, and thus increasing the capacitance of the storage capacitor of each pixel unit.

Figure 16:
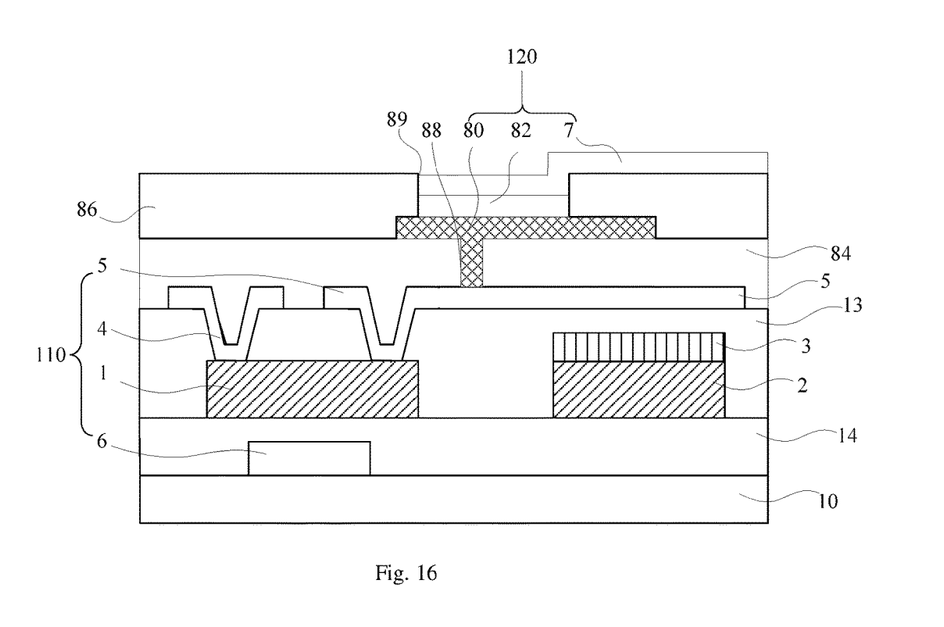
FIG. 16 is a schematic diagram of a part of each pixel unit of an AMOLED display substrate according to another embodiment of the present disclosure.

FIG. 16 is a schematic diagram of a part of each pixel unit of an AMOLED display substrate according to another embodiment of the present disclosure. As shown in FIG. 16, each pixel unit of the display substrate includes a thin film transistor 110 and a light emitting diode 120. A structure of the thin film transistor 110 is the same as that of the thin film transistor in the above embodiments, for example, the thin film transistor 110 may include a gate electrode 6, an active layer 1, a source electrode 4 and a drain electrode 5.

The light emitting diode 120 includes a bottom electrode 80, a top electrode 7 and a light-emitting layer 82 between the bottom electrode 80 and the top electrode 7. The bottom electrode 80 is electrically connected with the drain electrode 5, and a data signal is transmitted to the bottom electrode 80 via the thin film transistor 110 to drive the light emitting diode 120 to emit light.

In addition, each pixel unit further includes a first insulating layer 84 and a second insulating layer 86. The first insulating layer 84 covers the source electrode 4 and the drain electrode 5. The first insulating layer 84 is provided with a via hole 88. The bottom electrode 80 is arranged on the first insulating layer 84, and is electrically connected with the drain electrode 5 via the via hole 88. The second insulating layer 86 is arranged on the first insulating layer 84 and covers the bottom electrode 80. An opening 89 is arranged on the second insulating layer 86 corresponding to the bottom electrode 86. The light-emitting layer 82 is arranged inside the opening 89. The top electrode 7 is arranged on the second insulating layer 86, and is in contact with the light-emitting layer 82.

In addition, each pixel unit further includes a storage capacitor configured to maintain a voltage of the bottom electrode 80 during displaying one frame to realize an image display. In the embodiment as shown in FIG. 16, the storage capacitor includes a first storage capacitor and a second storage capacitor connected in parallel with the first storage capacitor.

The first storage capacitor includes a first electrode 3, a drain electrode 5 and an etch stop layer 13 between the first electrode 3 and the drain electrode 5. The first electrode 3 and the drain electrode 5 partly overlap in a direction perpendicular to the substrate 10, that is, there is an overlapping region between an orthographic projection of the first electrode 3 on the substrate 10 and an orthographic projection of the drain electrode 5 on the substrate 10. The electrode 3 is directly formed on the semiconductor layer 2, and the semiconductor layer 2 and the active layer 1 are formed on the gate insulating layer 14. In an embodiment, the first electrode 3 may be made of conductor material, which is directly formed on the semiconductor layer 2. For example, the first electrode 3 may be a metal layer directly formed on the semiconductor layer 2.

The second storage capacitor includes the top electrode 7, the drain electrode 5, and the first insulating layer 84 and the second insulating layer 86 between the top electrode 7 and the drain electrode 5. The top electrode 7 and the drain electrode 5 partly overlap in a direction perpendicular to the substrate 10, that is, there is an overlapping region between an orthographic projection of the top electrode 7 on the substrate 10 and an orthographic of the drain electrode 5 on the substrate 10. The top electrode 7 is electrically connected with the first electrode 3, as shown in FIG. 1.

An embodiment further provides a display device, which includes the above display substrate, such that the fabricating process is simplified, the cost is reduced, and the display quality is ensured.

The above descriptions are merely alternative embodiments of the present disclosure. It should be noted that, some improvements and substitutions can be made by those skilled in the art without departing from the principle of the present disclosure, and these improvements and substitutions shall also fall within the scope of the present disclosure.

What is claimed is:

1. A method for fabricating an active-matrix organic light emitting diode display substrate, comprising:
    forming a plurality of pixel units;
    wherein forming each of the pixel units comprises:
        forming a first storage capacitor, a second storage capacitor, a thin film transistor and a light emitting diode, wherein an active layer of the thin film transistor and a first electrode of the first storage capacitor are formed through a single patterning process, the first electrode of the first storage capacitor being made of conductor material,
        a second electrode of the first storage capacitor is a drain electrode of the thin film transistor,
        a first electrode of the second storage capacitor is the drain electrode of the thin film transistor,
        a second electrode of the second storage capacitor is a top electrode of the light emitting diode,
        the top electrode of the light emitting diode is electrically connected to the first electrode of the first storage capacitor.

2. The method according to claim 1, wherein forming the active layer of the thin film transistor and the first electrode of the first storage capacitor through the single patterning process comprises:
    forming a semiconductor film layer and a conductive film layer successively, and forming the active layer and the first electrode of the first storage capacitor by performing the single patterning process on the semiconductor film layer and the conductive film layer, wherein the active layer is formed from the semiconductor film layer, and the first electrode of the first storage capacitor is formed from the conductive film layer.

3. The method according to claim 2, wherein forming the active layer and the first electrode of the first storage capacitor by performing the single patterning process on the semiconductor film layer and the conductive film layer comprises:
    coating a photoresist on the conductive film layer;
    exposing the photoresist by using a mask plate with a halftone or gray tone, and developing to form a photoresist fully-reserved region, a photoresist partially-reserved region and a photoresist unreserved region, wherein the photoresist fully-reserved region corresponds to a region where the first electrode of the first storage capacitor is located, the photoresist partially-reserved region corresponds to a region where the active layer is located, and the photoresist unreserved region corresponds to the other region;
    removing the conductive film layer and the semiconductor film layer in the photoresist unreserved region;
    removing the photoresist in the photoresist partially-reserved region through an ashing process;
    removing the conductive film layer in the photoresist partially-reserved region; and
    forming the active layer and the first electrode by stripping the remaining photoresist.

4. The method according to claim 1, further comprising:
    forming an etch stop layer covering the active layer and the first electrode of the first storage capacitor, wherein the etch stop layer comprises a via hole; and
    forming a source electrode and the drain electrode of the thin film transistor on the etch stop layer with the source electrode and the drain electrode in electrical contact with the active layer through the via hole, wherein there is an overlapping region between an orthographic projection of the drain electrode on a plane where the display substrate is located and an orthographic projection of the first electrode of the first storage capacitor on the plane where the display substrate is located.

5. The method according to claim 1, further comprising:
    forming a bottom electrode and the top electrode of the light emitting diode, wherein the bottom electrode is electrically connected with the drain electrode of the thin film transistor.

6. An active-matrix organic light emitting diode display substrate, fabricated by the fabricating method according to claim 1.

7. The active-matrix organic light emitting diode display substrate according to claim 6, wherein there is a pattern of a semiconductor layer under the first electrode of the first storage capacitor, which is the same as a pattern of the first electrode of the first storage capacitor, and the semiconductor layer and the active layer are formed from one film layer.

8. The active-matrix organic light emitting diode display substrate according to claim 7, wherein there is an overlapping region between an orthographic projection of the first electrode of the first storage capacitor on a plane where the display substrate is located and an orthographic projection of the drain electrode of the thin film transistor on the plane where the display substrate is located, and an etch stop layer is between the first electrode of the first storage capacitor and the drain electrode to form the first storage capacitor.

9. The active-matrix organic light emitting diode display substrate according to claim 8, wherein the light emitting diode comprises a bottom electrode and the top electrode, the bottom electrode is electrically connected with the drain electrode, there is an overlapping region between an orthographic projection of the top electrode on the plane where the display substrate is located and an orthographic projection of the drain electrode on the plane where the display substrate is located, and an insulating layer is between the top electrode and the drain electrode to form a second storage capacitor.

10. A display device, comprising the active-matrix organic light emitting diode display substrate according to claim 6.

11. An active-matrix organic light emitting diode AMO-LED display substrate, comprising:
   a substrate;
   a gate electrode of a thin film transistor on the substrate;
   a gate insulating layer on the substrate and covering the gate electrode;
   an active layer and a semiconductor layer on the gate insulating layer;
   a first electrode of a first storage capacitor directly on the semiconductor layer;
   an etch stop layer on the gate insulating layer and covering the active layer and the first electrode of the first storage capacitor;
   a source electrode and a drain electrode of the thin film transistor on the etch stop layer, the source electrode and the drain electrode of the thin film transistor being in electrical contact with the active layer through a via hole in the etch stop layer; and
   a first storage capacitor and a second storage capacitor connected in parallel,
   wherein the drain electrode of the thin film transistor is a second electrode of the first storage capacitor and a first electrode of a second storage capacitor, a top electrode of the light emitting diode is a second electrode of the second storage capacitor,
   wherein the first electrode of the first storage capacitor and the drain electrode of the thin film transistor partly overlap in a direction perpendicular to the substrate, and the first electrode of the first storage capacitor, the drain electrode of the thin film transistor and the etch stop layer between the first electrode of the first storage capacitor and the drain electrode of the thin film transistor form the first storage capacitor,
   the top electrode of the light emitting diode is electrically connected to the first electrode of the first storage capacitor.

12. The active-matrix organic light emitting diode display substrate according to claim 11, wherein there is an overlapping region between an orthographic projection of the first electrode of the first storage capacitor on the substrate and an orthographic projection of the drain electrode of the thin film transistor on the substrate.

13. The active-matrix organic light emitting diode display substrate according to claim 11, further comprising:
   a first insulating layer on the etch stop layer and covering the source electrode and the drain electrode of the thin film transistor;
   a light emitting diode on the first insulating layer, wherein the light emitting diode comprises a bottom electrode, the top electrode and a light-emitting layer, and the bottom electrode is electrically connected with the drain electrode through the via hole in the first insulating layer; and
   a second insulating layer on the first insulating layer and covering the bottom electrode, wherein an opening is in the second insulating layer corresponding to the bottom electrode,
   wherein the light-emitting layer is inside the opening, the top electrode is on the second insulating layer and in contact with the light-emitting layer; the top electrode and the drain electrode partly overlap in a direction perpendicular to the substrate; the top electrode, the drain electrode, and the first insulating layer as well as the second insulating layer between the top electrode and the drain electrode form the second storage capacitor.

14. The active-matrix organic light emitting diode display substrate according to claim 13, wherein there is an overlapping region between an orthographic projection of the top electrode on the substrate and an orthographic projection of the drain electrode of the thin film transistor on the substrate.

15. The active-matrix organic light emitting diode display substrate according to claim 11, wherein the active layer and the semiconductor layer are directly formed on the gate insulating layer, and the active layer and the semiconductor layer are made of the same material.

16. The active-matrix organic light emitting diode display substrate according to claim 15, wherein the first electrode of the first storage capacitor is made of conductor material.

17. The active-matrix organic light emitting diode display substrate according to claim 15, wherein the first electrode of the first storage capacitor is a metal layer.

* * * * *